United States Patent [19]

Taninaka et al.

[11] Patent Number: 4,831,587

[45] Date of Patent: May 16, 1989

[54] MEMORY ADDRESS CIRCUIT HAVING FUNCTION OF EXCHANGING SELECTED BITS OF ADDRESS INPUT

[75] Inventors: Hiroyuki Taninaka; Mikio Saitou, both of Tokyo, Japan

[73] Assignee: NEC Corporation, Tokyo, Japan

[21] Appl. No.: 71,519

[22] Filed: May 27, 1987

[30] Foreign Application Priority Data

May 27, 1986 [JP] Japan ................................. 61-122659

[51] Int. Cl.$^4$ ............................................. G06F 9/00
[52] U.S. Cl. ................................................. 365/104
[58] Field of Search ... 364/200 MS File, 900 MS File; 365/104, 222, 185, 189

[56] References Cited

U.S. PATENT DOCUMENTS 4,651,275  3/1987  McDonough ........................ 364/200

Primary Examiner—Gareth D. Shaw
Assistant Examiner—John G. Mills
Attorney, Agent, or Firm—Foley & Lardner, Schwartz, Jeffery, Schwaab, Mack, Blumenthal & Evans

[57] ABSTRACT

A memory associated with an address circuit receiving an address signal to designate a location of the memory to be accessed. The address circuit includes an X-decoder and a Y-decoder associated to the memory, and a multiplexor receiving at least a portion of an address input and adapted to selectively distribute the above portion of the address input to the X-decoder and the Y-decoder. Specifically, the multiplexor receives at least one first bit of a portion of the address signal to be inputted to the X-decoder and at least one second bit of the remaining portion of the address signal to be iputted to the Y-decoder. In a first condition, the multiplexor operates to supply the first bit and the second bit of the address input to the X-decoder and the Y-decoder, respectively. In a second condition, the multiplexor operates to supply the first bit and the second bit of the address input to the Y-decoder and the X-decoder, respectively.

4 Claims, 4 Drawing Sheets

MEMORY ADDRESS CIRCUIT HAVING FUNCTION OF EXCHANGING SELECTED BITS OF ADDRESS INPUT

BACKGROUND OF THE INVENTION

1. Field of the Invention

The present invention relates to a memory incorporated in a microcomputer, and more particularly to an address circuit associated with a read only memory.

2. Description of related art

Heretofore, a microcomputer such as a one-chip microcomputer comprises a read only memory (ROM) storing a microprogram for controlling an operation of the microcomputer. As shown in FIG. 1, a ROM 10 is associated with an address circuit which is composed of an X-decoder 12 and a Y-decoder 14. These decoders 12 and 14 are adapted to receive respective allocated portions of a given address signal through buses 16 and 18, respectively. The X-decoder 12 and the Y-decoder 14 cooperate to allow a data or microinstruction designated by the given address signal to be read out through an output 20.

Further, if the capacity or size of the ROM is determined, the sum of the input numbers of the X-decoder 12 and the Y-decoder 14 is directly decided. Namely, if the number of inputs of the X-decoder is settled, the input number of the Y-decoder is accordingly determined. In addition, the numbers of the respective outputs of the X- and Y-decoders are also decided. These output numbers of the decoders and the output bit number of the ROM will determine the size of the ROM 10 in the X direction and in the Y direction.

However, the conventional address circuits of the ROM have been adapted to distribute all bits of an input address signal to the X-decoder and the Y-decoder, so that the input address signal is full-decoded without exception. Therefore, even if the ROM includes addresses which are never accessed, the X-decoder and the Y-decoder had to comprise all circuits required for full-decoding the input address. This will result in a wasteful increase of a LSI chip size.

SUMMARY OF THE INVENTION

Accordingly, it is an object of the present invention is to provide a memory which has overcome the above mentioned drawback of the conventional one.

Another object of the present invention is to provide an address circuit which is associated to a read only memory and which makes it possible to save the chip size.

Still another object of the present invention is to provide a memory address circuit which includes an X-decoder and Y-decoder and which can save circuit elements of the X- or Y-decoder when a memory has an address that is never accessed.

The above and other objects of the present invention are achieved in accordance with the present invention by a memory associated with an address circuit receiving an address signal to designate a location of the memory to be accessed, the address circuit including an X-decoder and a Y-decoder associated to the memory, and a multiplexor receiving at least a portion of an address input and adapted to selectively distribute the above portion of the address input to the X-decoder and the Y-decoder.

Specifically, the multiplexor receives at least one first bit of a portion of the address signal to be inputted to the X-decoder and at least one second bit of the remaining portion of the address signal to be inputted to the Y-decoder. In a first condition, the multiplexor operates to supply the first bit and the second bit of the address input to the X-decoder and the Y-decoder, respectively. In a second condition, the multiplexor operates to supply the first bit and the second bit of the address input to the Y-decoder and the X-decoder, respectively.

With the above arrangement, the multiplexor can mutually exchange a portion of the address to the X-decoder and a portion of the address to the Y-decoder. Therefore, the exchange of these address portions is so set that empty addresses being never accessed are collected to one or more output or decode lines of the X- or Y-decoder. As a result, for example, if one output line of the X- or Y-decoder is associated with only the empty addresses, a circuit associated to the output line of the decoder can be omitted. In other words, the number of circuit elements required for the X- or Y-decoder can be decreased, which will result in a decrease of chip area necessary for the memory and in or increase of an operation speed of the memory. These effects are very convenient to the microcomputer.

The above and other objects, features and advantages of the present invention will be apparent from the following description of the preferred embodiments of the invention with reference to the accompanying drawings.

DESCRIPTION OF THE PREFERRED EMBODIMENT

Figure 1:
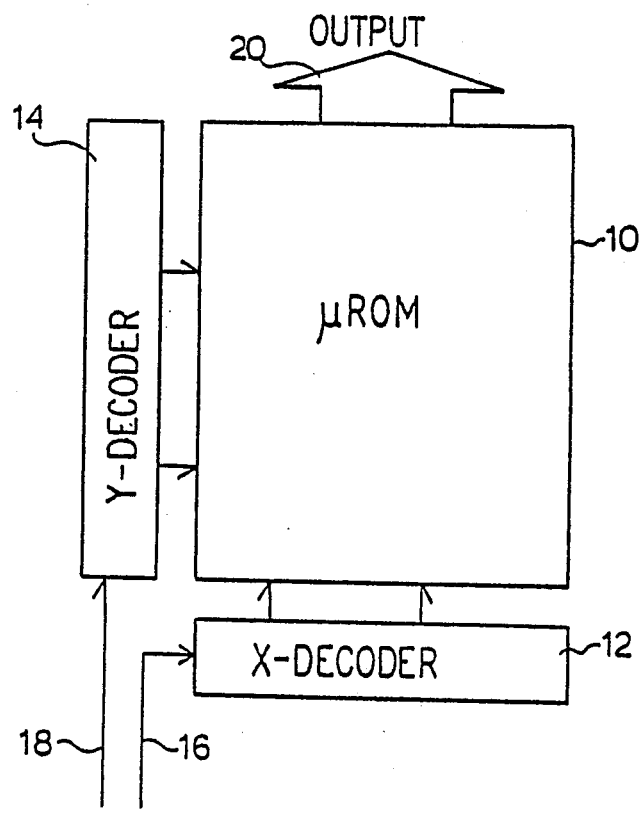
FIG. 1 is a block diagram illustrating the conventional structure of a read only memory and an associated address circuit.
Figure 2:
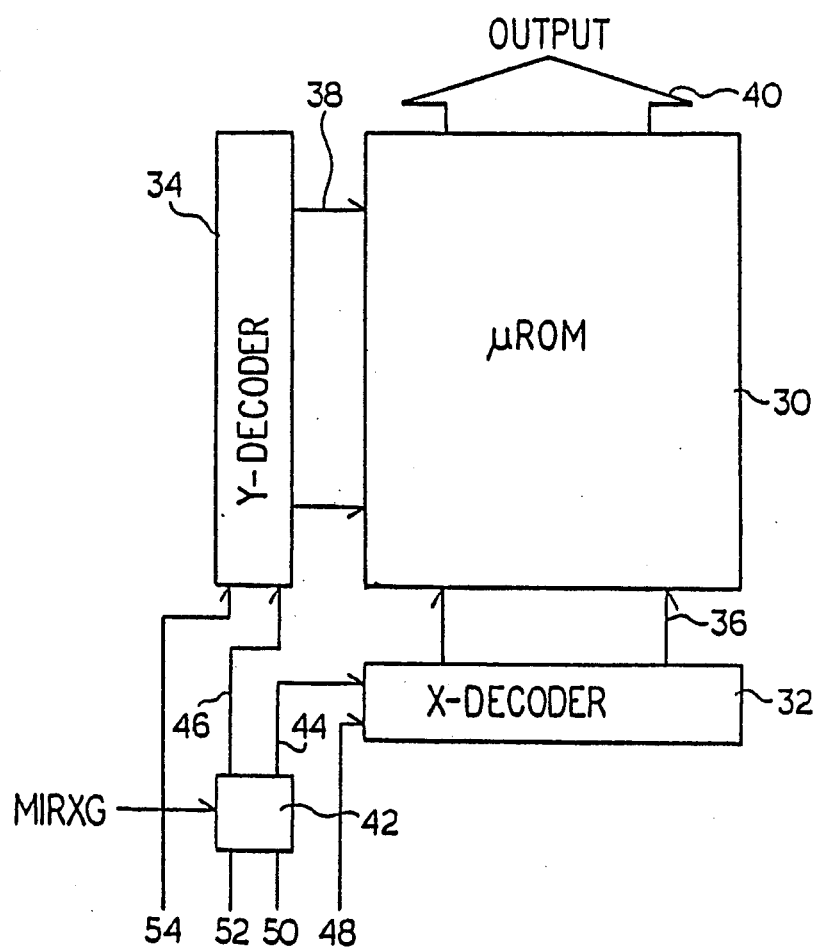
FIG. 2 is a block diagram of a read only memory and an associated address circuit in accordance with the present invention.

Referring to FIG. 2, there is shown a read only memory (ROM) 30 of the matrix structure. The ROM 30 is associated with an X-decoder 32 and a Y-decoder 34 which are adapted to receive respectively allocated bits of an address input. The X-decoder 32 operates to enable one of the lines 36 connected to the ROM 30, and the Y-decoder 34 operates to enable one set of a plurality of sets of lines 38 connected to the ROM 30, so that a data or microinstruction designated by the address input is read out through an output 40.

Further, there is provided a multiplexor 42 adapted to receive a portion of the address input and having a pair of outputs 44 and 46 connected to the X-decoder 32 and the Y-decoder 34, respectively. Specifically, the address input is divided into four portions 48, 50, 52 and 54. The first portion of the address input is directly inputted to the X-decoder 32. The second and third portions 50 and 52 are inputted to the multiplexor 42. The multiplexor 42 is controlled by a selection signal MIRXG to supply the second and third portions 50 and 52 to the X-decoder 32 and the Y-decoder 34, respectively, when it is in a first condition, and also to supply the second and third portions 50 and 52 to the Y-decoder 34 and the X-decoder 32, respectively, when it is in a second condition.

Figure 3:
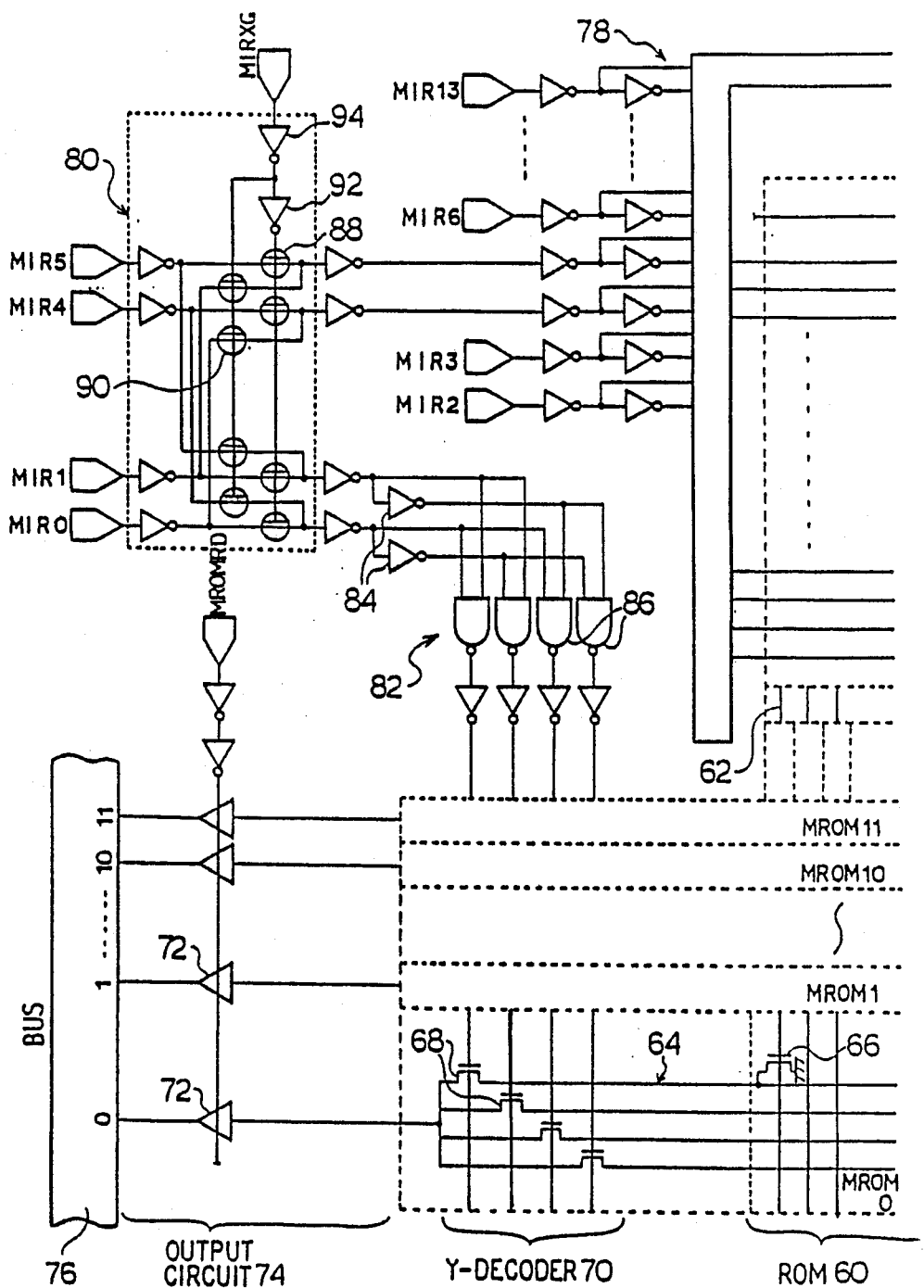
FIG. 3 is a detailed circuit diagram of the address circuit and the multiplexor shown in FIG. 2.

Turning to FIG. 3, there is shown a partially detailed circuit of a memory, an associated address circuit and a multiplexor in accordance with the present invention. As shown in FIG. 3, a ROM 60 is of a matrix structure having a plurality of word lines 62 and a plurality of bit lines 64 orthogonal to the word lines 62. At each of the intersections between the word lines 62 and the bit lines 64, there is located one MOS transistor 66 constituting one elementary memory. As seen from the drawing, the shown ROM 60 is of a word structure having each word consisting of 12 bits.

Each four lines of the bit lines 64 are connected through transfer gates 68 provided in a Y-decoder 70 commonly to an input of one corresponding tristate output buffer 72 provided in an output circuit 74. These output buffers 72 are controlled by a ROM read signal MROMRD, and connected at their output terminal to corresponding lines of a bus 76.

Each of the word lines 62 is selectively enabled by an associated X-decoder 78, which can be a well-known one.

An address signal to be inputted to the ROM shown in FIG. 3 is composed of 14 bits of MIR 0 to MIR 13. Two least significant bits MIR 0 and MIR 1 of the address signal are ordinarily supplied through a multiplexor 80 to a decoding section 82 of the Y-decoder 70. The decoding section 82 of the Y-decoder 70 includes a pair of inverters 84 and four AND gates 86 connected as shown to decode a two-bit input so as to enable one selected transfer gate 68 of each set consisting of four transfer gates.

The other bits of the address input excluding fifth and sixth less significant bits MIR 4 and MIR 5 are directly inputted to the X-decoder 78, and the fifth and sixth less significant bits MIR 4 and MIR 5 are inputted through the multiplexor 80 to the X-decoder 78. As shown in FIG. 3, the multiplexor 80 includes four first transfer gates 88 connected between the address inputs MIR 0, MIR 1, MIR 4 and MIR 5 and the decoding section 82 of the Y-decoder 70 and the input of the X-decoder 78, respectively. The multiplexor 80 also includes four second transfer gates 90 connected between the address inputs MIR 0, MIR 1, MIR 4 and MIR 5 and the input of the X-decoder 78 and the decoding section 82 of the Y-decoder 70. The first transfer gates 88 are connected at their control terminals to an output of an inverter 92, and the second transfer gates 90 have their control terminals connected to an input of the inverter 92, which is connected to an output of another inverter 94 adapted to receive at its input the selection signal MIRXG. Therefore, if the signal MIRXG is at a high level, the transfer gates 88 are on and the transfer gates 90 are off, so that the address input MIR 0, MIR 1, MIR 4 and MIR 5 are supplied to the decoding section 82 of the Y-decoder 70 and the input of the X-decoder 78, respectively. But, if the signal MIRXG is at a low level, the transfer gates 88 are off and the transfer gates 90 are on, so that the address inputs MIR 0 and MIR 1 are supplied to the X-decoder 78 and the address inputs MIR 4 and the MIR 5 are supplied to the decoding section 82 of the Y-decoder 70.

Figure 4:
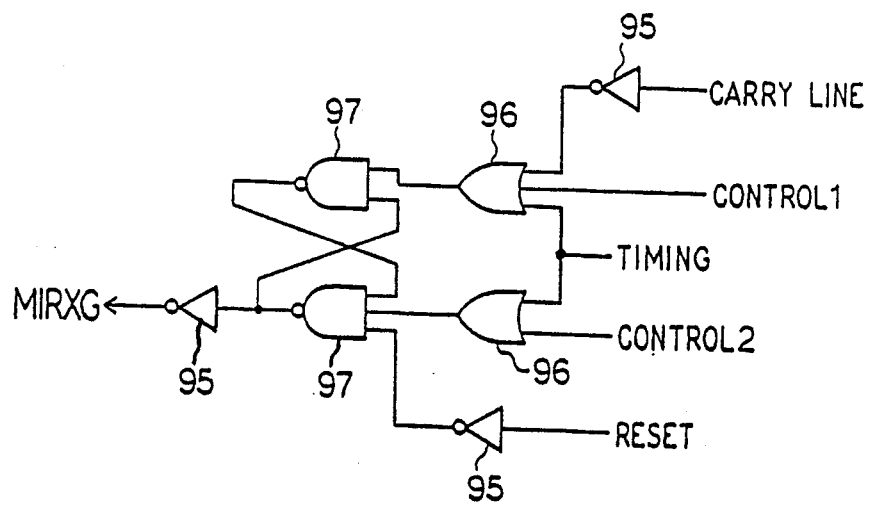
FIG. 4 is a circuit diagram of a generator for a signal controlling the multiplexor shown in FIG. 3.

Turning to FIG. 4, there is shown one example of a circuit for generating the selection signal MIRXG. The shown circuit includes three inverters 95, two OR gates 96 and two AND gates 97 connected as shown to receive a carry line of a ROM address generator (not shown), control signals 1 and 2, a timing signal and a reset signal. The selection signal MIRXG is brought into a high level "H", at the reset signal="L" (low level), the control signal 1="L", the control signal 2="H", the timing signal="L", and the carry line="H".

Next, operation will be explained with reference to FIG. 2 and under the assumption that the first to fourth portions 48, 50, 52 and 54 of the address input are composed of 0 bit, 2 bits, 2 bits and 4 bits, respectively, and the lines 44 and 46 are two bits, respectively. Further, assume that the ROM 30 has a plurality of empty addresses which are never accessed. Therefore, by generating the selection signal MIRXG from the address signal so as to mutually exchange one or more input bits of the X-decoder and the corresponding number of input bits of the Y-decoder, one output of the X- or Y-decoder can be assigned to the empty area of address. Therefore, the number of the output lines of the X- or Y-decoder can be decreased.

TABLE

|  | ADDRESS BITS | | | | | | | | CONDITION |
|---|---|---|---|---|---|---|---|---|---|
|  | MSB, | 6, | 5, | 4, | 3, | 2, | 1, | LSB |  |
|  | 0 | 0 | 0 | 0 | 0 | 0 | 0 | 0 |  |
| ADDRESS A | 1 | 0 | 0 | 0 | 1 | 0 | 0 | 0 | EMPTY ADDRESS |
| ADDRESS B | 1 | 0 | 0 | 0 | 1 | 0 | 0 | 1 | USE ADDRESS |
| ADDRESS C | 1 | 0 | 0 | 0 | 1 | 0 | 1 | 0 | USE ADDRESS |
| ADDRESS D | 1 | 0 | 0 | 0 | 1 | 0 | 1 | 1 | USE ADDRESS |
| ADDRESS E | 1 | 0 | 0 | 1 | 1 | 0 | 0 | 0 | EMPTY ADDRESS |
| ADDRESS F | 1 | 0 | 1 | 0 | 1 | 0 | 0 | 0 | EMPTY ADDRESS |
| ADDRESS G | 1 | 0 | 1 | 1 | 1 | 0 | 0 | 0 | EMPTY ADDRESS |
|  | 1 | 1 | 1 | 1 | 1 | 1 | 1 | 1 |  |

TABLE-continued

| ADDRESS BITS | | | | | | | | CONDITION |
|---|---|---|---|---|---|---|---|---|
| MSB, | 6, | 5, | 4, | 3, | 2, | 1, | LSB | |
| | ←—Y-DECODER—→ | | | | | | X-DECODER | |

The above TABLE shows one example of an address mapping. In the example shown in the TABLE, the address space includes four empty addresses A, E, F and G and three use addresses B, C and D. Therefore, if the two least significant two bits "1" and "LSB" are mutually exchanged by the two bits "4" and "5", the addresses B, C and D are replaced by the addresses E, F and G, respectively. With this exchange of the address bits and the empty address A, a decode line for "100010" of the Y-decoder can be omitted.

A decode line for the X-decode can be also omitted in a similar manner.

For example, review will be made on a ROM of 16K words—12 bits as shown in FIG. 3. In this case, the ROM consists of 196608 bits or transistors ($2^{14} \times 12$). Assume that this ROM is modified to a memory structure of $428 \times 48$ bits (=20554 bits). In this case, therefore, the X-decoder has the capacity of $428 \times 12$ bits (=5136 bits). Ordinarily, each output buffer of the X-decoder includes two NAND gates and one inverter.

Therefore, in the memory structure of $2^{14} \times 12$ bits, $2^{14} \times 12$ transistors are required as memory elements. Twelve (12) output buffers (72 transistors) are required, and twelve (12) sense amplifiers are required. Further, four (4) buffers (8 transistors) are required for the Y-decoder. In total, 196700 transistors are required.

On the other hand, in the memory structure of $428 \times 48$ bits, the memory itself contains 20544 transistors. But, 428 output buffers (2568 transistors) are required for the X-decoder. The twelve (12) sense amplifiers and the four buffers for the Y-decoder are still required. Further, a MIRXG signal generator requires about forty (40) transistors. Therefore, the total number is 23172. Namely, the required number of element is reduced to about 12%. In addition, the required layout area is reduced to about 45%.

As seen from the above, the word number and the bit length of the memory structure can be changed without modifying the bit length of the address signal. In addition, the capacity of the memory can be easily reduced without changing the format of the address signal.

The invention has thus been shown and described with reference to the specific embodiments. However, it should be noted that the invention is in no way limited to the details of the illustrated structures but changes and modifications may be made within the scope of the appended claims.

We claim:

1. A memory address circuit for a read only memory which includes a plurality of word lines, a plurality of bit lines and a plurality of memory cells located at predetermined ones of intersections of the word lines and the bit lines, said memory address circuit receiving an X-address signal and a Y-address signal in order to designate locations of the read only memory to be accessed, said locations being fewer in number than the total number of read only memory locations and at least one of said plurality of word lines and and said plurality of bit lines being correspondingly reduced comprising:
   an X-decoder responding to said X-address signal for selecting one word line of said memory,
   a Y-decoder responding to said Y-address signal for selecting a predetermined number of bit lines of said bit lines of said memory,
   an output circuit for outputting signals appearing on said selected bit lines to corresponding bit lines of a bus, and
   an address supplying circuit, including a multiplexer, for receiving an address signal including first, second and third portions and also for receiving a switching signal, said address supplying circuit operating to supply said first and second portions to the X-decoder and said third portion to the Y-decoder as said X-address signal and said Y-address signal, respectively, when said switching signal is at a first logic level, said address supplying circuit also operating to supply said first and third portions to the Y-decoder and said second portion to the X-decoder as said Y-address signal and said X-address signal, respectively, when said switching signal is at a second logic level different from said first logic level.

2. An address circuit coupled to a read only memory for receiving an address signal to designate a location of a memory to be accessed, the number of locations being fewer in number than the total number of read only memory locations with access signals to the read only memory being correspondingly reduced, said address circuit comprising:
   an X-decoder and a Y-decoder associated with said memory, and
   a multiplexor for receiving predetermined first and second portions of an address input and also for receiving a switching signal, said multiplexor operating to supply said first portion and said second portion of said address input to the X-decoder and the Y-decoder, respectively, when said switching signal is at a first logic level, said multiplexor also operating to supply said first portion and said second portion of said address input to the Y-decoder and the X-decoder, respectively, when said switching signal is at a second logic level different from said first logic level.

3. An address circuit as claimed in claim 2, wherein the multiplexor receives, as said first portion, at least one bit of a portion of the address signal to be inputted to the X-decoder and, as said second portion, at least one bit of the remaining portion of the address signal to be inputted to the Y-decoder.

4. An address circuit as claimed in claim 2, wherein the multiplexor receives, as said first portion, a plurality of bits contained in a portion of the address signal to be inputted to the X-decoder and, as said second portion, the corresponding number of bits contained in the remaining portion of the address signal to be inputted to the Y-decoder.

* * * * *